(12) United States Patent
Walton

(10) Patent No.: US 6,614,922 B1
(45) Date of Patent: Sep. 2, 2003

(54) WIRE PATTERN TEST SYSTEM

(75) Inventor: Eric K. Walton, Columbus, OH (US)

(73) Assignee: The Ohio State University, Columbus, OH (US)

( * ) Notice: Subject to any disclaimer, the term of this patent is extended or adjusted under 35 U.S.C. 154(b) by 0 days.

(21) Appl. No.: 09/477,594

(22) Filed: Jan. 4, 2000

(51) Int. Cl.$^7$ ................................................ G06K 9/00
(52) U.S. Cl. ........................................ 382/141; 348/86
(58) Field of Search ................................ 382/141–154; 348/86, 87, 125, 126, 127; 324/51, 52, 57, 56; 250/252.1; 73/866

(56) References Cited

U.S. PATENT DOCUMENTS

| | | |
|---|---|---|
| 3,911,357 A | 10/1975 | Adam et al. |
| 4,276,509 A | 6/1981 | Bryant et al. |
| 4,395,677 A | 7/1983 | Petersdorf et al. |
| 4,584,523 A | 4/1986 | Elabd |
| 4,712,057 A | 12/1987 | Pau |
| 5,089,700 A | 2/1992 | Sapia et al. |
| 5,756,991 A | 5/1998 | Risinger et al. |
| 5,821,904 A | 10/1998 | Kakizawa et al. |
| 5,834,661 A * | 11/1998 | Nonaka et al. ................ 73/866 |
| 5,864,319 A | 1/1999 | Paulus |

* cited by examiner

*Primary Examiner*—Samir Ahmed
*Assistant Examiner*—Vikkram Bali
(74) *Attorney, Agent, or Firm*—Standley & Gilcrest LLP

(57) ABSTRACT

The present invention includes testing devices and testing systems. This invention also includes machines or electronic apparatus using these aspects of the invention. The present invention also includes methods and processes using these devices and systems. In a preferred embodiment, a testing device and method are described that utilize infrared imaging and computer analysis thereof in detecting and measuring continuity, uniformity, and presence of inhomogeneities of wire heating grids in automotive windshields. The computer is capable of autonomous decision making, and can signal industrial equipment such as robotic actuators to automatically remove faulty windshields from the assembly line.

17 Claims, 3 Drawing Sheets

WIRE PATTERN TEST SYSTEM

TECHNICAL FIELD OF THE INVENTION

The present invention is in the field of wiring and wire patterns.

BACKGROUND OF THE INVENTION

This invention relates to methods and apparatus useful in the electronics and automotive industries. More specifically, this invention relates to the testing of heater wiring useful in automotive applications.

A printed conductive pattern is commonly printed on the rear window (backlite) of an automobile for purposes of defogging and deicing. Often, a silver paste is silk-screened onto a glass substrate and heated to form a pattern of silver fret lines. Similar conductive patterns may also be constructed of actual wires imbedded in or attached to the automotive glass. Such patterns have also been used on the front window of automobiles for deicing the windshield wiper rest position. Other applications of such patterns include antenna applications of various types. The automotive glass may be acquired commercially with the conductive pattern already provided.

Generally, a two-dimensional drawing of a glass window is produced. A conductor pattern drawing is then produced based on given specifications, such as conductor width, distance between conductors, etc. A peeling film is then cut along an outline of the conductor pattern to produce a cut mask, in which the conductor portion remains uncut. The cut mask is adhered to a screen on which a photosensitive material is applied. The resultant cut mask is exposed and washed with water to prepare a print screen, in which a conductor portion corresponds to an opening. The screen overlaps the glass plate to print the conductive paste.

The width of each conductor is typically 1 mm or less so as not to interfere with the field of view of a person operating the vehicle. In addition, the lengths of heater wires may be different from one another, so that the widths of respective conductors may change to control the resistances of the wires. In order to differentiate the heating of a central, high-temperature area from that of a peripheral, low-temperature area, the width of an individual heater wire may be modified over different portions of the heating area.

For this reason, drawing of a conductor pattern and preparation of a cut mask are performed by extremely sophisticated and precise manual operations. Still, it is difficult to maintain consistent thickness and continuity throughout the entire wiring pattern while varying width from wire to wire, and while also varying the width along each individual wire.

As the complexity of these patterns increases, testing becomes more difficult and expensive. For example, interconnecting lines are often used along with the traditional heating lines to allow use of a backlite grid as an antenna as well as a heater grid. Unfortunately, these interconnecting lines make the detection of broken heating lines more difficult, as electrical current may now flow around the broken part and heat the remainder of the heating line.

It is also desirous to minimize the amount of time required to test each conductive pattern, as automotive parts such as backlites are manufactured at a known rapid rate. A typical automotive window glass manufacturing system requires a complete operation in 20 seconds or less.

It is therefore an object of the present invention to develop a system and apparatus for quickly, inexpensively, and accurately testing the performance of such a conductive pattern.

Although described with respect to the field of automotive vehicle components, it will be appreciated that similar advantages of quick and accurate testing may obtain in other applications of the present invention. Such advantages may become apparent to one of ordinary skill in the art in light of the present disclosure or through practice of the invention. For example, this invention may have applications in other situations where heated regions of any other type of material need to be tested.

SUMMARY OF THE INVENTION

The present invention includes testing devices and testing systems. This invention also includes machines or electronic apparatus using these aspects of the invention. The present invention may also be used to upgrade, repair or retrofit existing machines or electronic devices or instruments of these types, using methods and components used in the art. The present invention also includes methods and processes for using these devices and systems.

The testing system of the present invention comprises an article of manufacture, such as an automotive windshield or backlite, having a conductive pattern placed on its surface or embedded within. An electrical power source is placed in contact with the conductive pattern, whereby electrical current may be circulated throughout at least a portion of the pattern. An infrared detection device, such as an infrared camera, is positioned sufficiently near the article of manufacture, and is adapted to collect data from the selected portion of the conductive pattern. A data collection device in communication with the infrared detection device is then adapted to receive the infrared data from the detection device.

The conductive pattern may comprise a printed conductor, such as silver or copper fret, or may comprise actual wire embedded in the article of manufacture.

The data collection device may be any appropriate device, such as a computer adapted to collect data from the infrared detection device, process the data, and determine the performance of at least a portion of the conductive pattern. The performance determined may include any appropriate characteristic, such as continuity, uniformity, or homogeneity. The data collection device may then send a signal or instructions to robotic actuators or other industrial apparatus, whereby parts that do not meet predetermined performance criteria may be removed from the assembly line. The data collection device may alternatively send performance data for each part to a data storage apparatus for later retrieval and analysis.

Also included in the present invention is a method of testing a conductive pattern. In the method, a first set of infrared data is collected from at least a portion of a conductive pattern. Electrical current is then circulated throughout that portion of the conductive pattern. A second set of infrared data is then collected from the portion. The first set of infrared data is then subtracted from the second set of infrared data, whereby any effects of pre-existing thermal nonuniformities may be removed. The performance of at least that portion of the conductive pattern may then be determined. The performance determined may include any appropriate characteristic, such as continuity, uniformity, and homogeneity. This method may also include autonomous decision making, based upon pre-determined criteria and thresholds, and the providing of instructions to industrial equipment such as microprocessors and robotic actuators, as known and used in the art.

The present invention also includes a system for determining the thermal performance of such a conductive pattern. The system utilizes thermal detector, such as an infrared camera or other infrared detection device known in the art. The thermal detector is preferably adapted to generate first and second data sets comprising infrared data of the conductive pattern. The data sets may be captured while different external currents are applied to the conductive pattern. In a preferred embodiment, the first data set is captured with no external current applied to the conductive pattern, while the second data set is captured with the conductive pattern having an external voltage applied for a time sufficient to appropriately heat the conductive pattern. The data sets may comprise image data captured by an infrared camera and stored in a temporary data buffer.

The system also utilizes a microprocessor. The microprocessor has processing instructions for comparing the first and second data sets, whereby preexisting thermal effects or conditions may be removed from the second data set. The microprocessor may then determine the performance of the conductive pattern using the results of the comparison between data sets. The microprocessor may then report the performance results. This reporting may be any signal or transfer of data made to a data storage unit, industrial machinery, or display apparatus known in the art.

A preexisting data set may also be stored in the system or data storage device, the preexisting data set preferably containing information pertaining to the conductive pattern. This information may include pattern coordinates, performance criterion, and preferred thermal profiles. The values of these parameters may vary depending upon the part or conductive pattern being tested. In a typical industrial application, one testing apparatus may be used to test several different parts, such as windshields for several models of automobile. This preexisting data may then also be compared by the microprocessor to the second data set.

The microprocessor may also contain instructions for generating a thermal profile for the second data set. The determination of performance may then be determined based upon the thermal profile, such as by applying thermal criterion or thresholds to the profile.

Also included in the present invention is a manufacturing system for testing articles of manufacture comprising conductive patterns. The manufacturing system preferably comprises a conveyance device that is adapted to convey the articles of manufacture. This may include any appropriate conveyance device known in the art, such as a conveyor belt or assembly line. The system also preferably includes a station along the conveyance device for testing the articles of manufacture. This station preferably comprises an electrical power source that may be brought in contact with the conductive pattern, whereby electrical current may be circulated throughout at least a portion of the pattern. The station preferably also comprises an infrared imaging device. The infrared imaging device, such as an infrared camera or infrared sensor, is preferably adapted to collect image data from at least a portion of the conductive pattern. The station preferably also includes a computer adapted to collect the image data from the infrared imaging device, process the image data, determine the performance of at least a portion of the conductive pattern, and report the results of the performance.

The manufacturing system may also comprise a robotic actuator adapted to receive the results from the computer. The robotic actuator may be adapted to remove from the conveyance device any articles of manufacture failing the performance determination. The actuator may also be adapted to move any such article of manufacture onto a second conveyance device.

The manufacturing system may also comprise a marking device, the marking device adapted to mark certain articles of manufacture based upon the determination of performance. The manufacturing system may additionally comprise a data storage device adapted to receive and store data pertaining to the determination of performance. This data may be stored temporarily, and may be adapted to be retrieved upon command. The manufacturing system may also comprise a display device, such as a monitor or series of LED's, adapted to receive and display data pertaining to the determination of performance.

DETAILED DESCRIPTION OF THE PREFERRED EMBODIMENT(S)

In accordance with the foregoing summary, the following presents a detailed description of the preferred embodiment of the invention that is currently considered to be the best mode.

Figure 1:
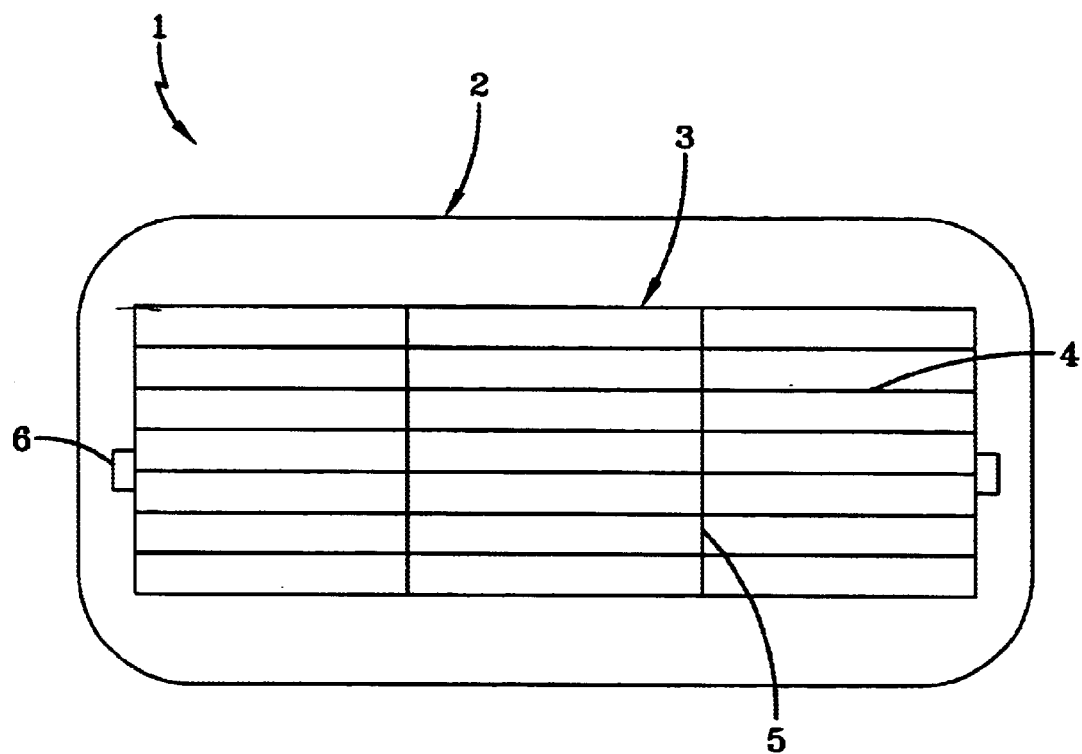
FIG. 1 is a front elevational view of a typical automotive backlite grid pattern that may be used in accordance with one embodiment of the present invention.

A Referring to FIG. 1, a typical automotive backlite (rear window) grid pattern 1 is shown. A conductive pattern 3 is shown on an automotive backlite 2 to cover a substantial portion of the visible area of the backlite. The conductive pattern 3 shown comprises both horizontal heating lines 4 and vertical interconnecting lines 5. If one section of a heating line 4 is broken, the interconnecting lines 5 may isolate the broken line and permit the remainder of the heating line to continue to function. The horizontal heating lines run between the electrically charged vertical edges 6 ("bus bars"). Electrical contacts for generating current flow are preferably connected to the conductive pattern 3 via extended portions, such as tabs, of the bus bars 6.

It should be pointed out as an advantage of the present invention that is also possible to measure patterns comprising vertical heating lines, with horizontal interconnecting lines running between horizontal bus bars, along with various other uniform or non-uniform designs, of any presentation angle and curvature.

Figure 2:
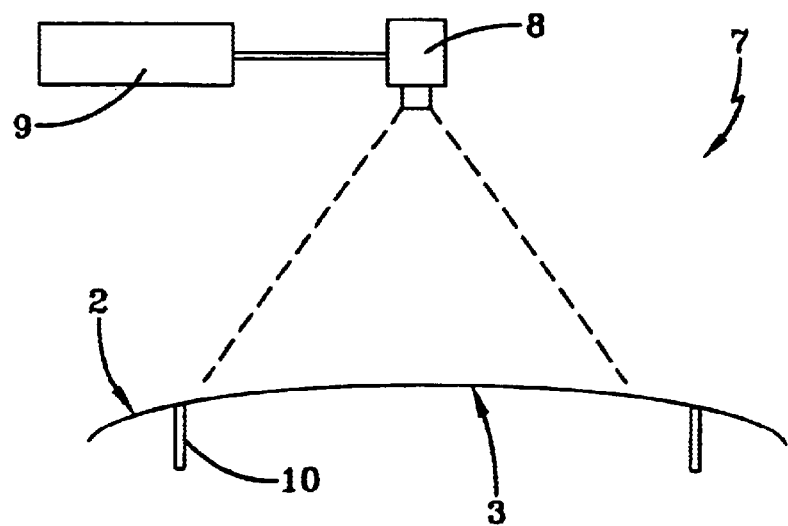
FIG. 2 is a diagram of a testing system that may be used in accordance with one embodiment of the present invention.

FIG. 2 shows a preferred testing system 7 of the present invention. An automotive backlite 2 is shown with an appropriate conductive pattern 3. The backlite 2 is preferably first brought into an inspection station and positioned appropriately, such as through the use of alignment pins. An infrared camera 8 or other infrared detection device may then take an initial infrared image before any current is circulated through the conductive pattern 3. The camera 8 may image the conductive pattern from either side of the backlite 2, and the backlite may be curved either upward or downward.

Next, a current source is preferably brought into contact with the conductive pattern 3, such as through the use of conductive probes 10 which may contact the conductive pads of the bus bars of the conductive pattern 3. An example of an appropriate power supply is an HPD 30–40 SX power supply (0–30V, 0–40 A) manufactured by Xantrex Inc., with the optional RS 232 control and readout. Sufficient electrical current is preferably then developed to heat the wires and the backlite 2 in the neighborhood of the wires.

The infrared camera 8 may then collect image data of the conductive pattern 3 at one or more times during the heating process. It is preferred that the camera be set to fully span the maximum temperature range that the glass piece will undergo during the production run. A preferred camera will have on-camera settings that can be adjusted to give operation over its full linear range (black to white) as the temperature of the piece changes. Once set, these levels are preferably converted to analog NTSC voltages and sent to a computer. For convenience, an NTSC monitor may be set up next to the camera for viewing. Cameras with automatic level setting options may additionally permit the system to automatically adjust for changes in the ambient temperature of the piece.

A computer 9 may be used to collect the data from the infrared camera 8. In a preferred embodiment the computer is running an operating system such as Windows NT, and an appropriate application development package such as Visual Basic. The computer preferably also contains an internal I/O board such as a PCI-PDIS08 produced by Computer Boards, Inc. This particular I/O board is optically isolated, with eight inputs and eight relay outputs, and is designed for 24V operation.

The heating dynamics of the part, the size of the image, the resolution of the camera, and the thermal sensitivity of the camera may all be considered at this stage to determine accuracy. In a preferred embodiment, a TVS-100 series thermal video system is used, manufactured by Avio Incorporated and sold in the United States by Cincinnati Electronics. This particular video system comprises a 14° F. to 572° F. infrared camera with NTSC analog output. It is also preferred in this embodiment that the computer utilize an appropriate board for the PCI bus, such as a DT3155 frame grabber by Data Translation Inc. This board permits controlled capture of the analog NTSC signal put out by the infrared camera.

Figure 3:
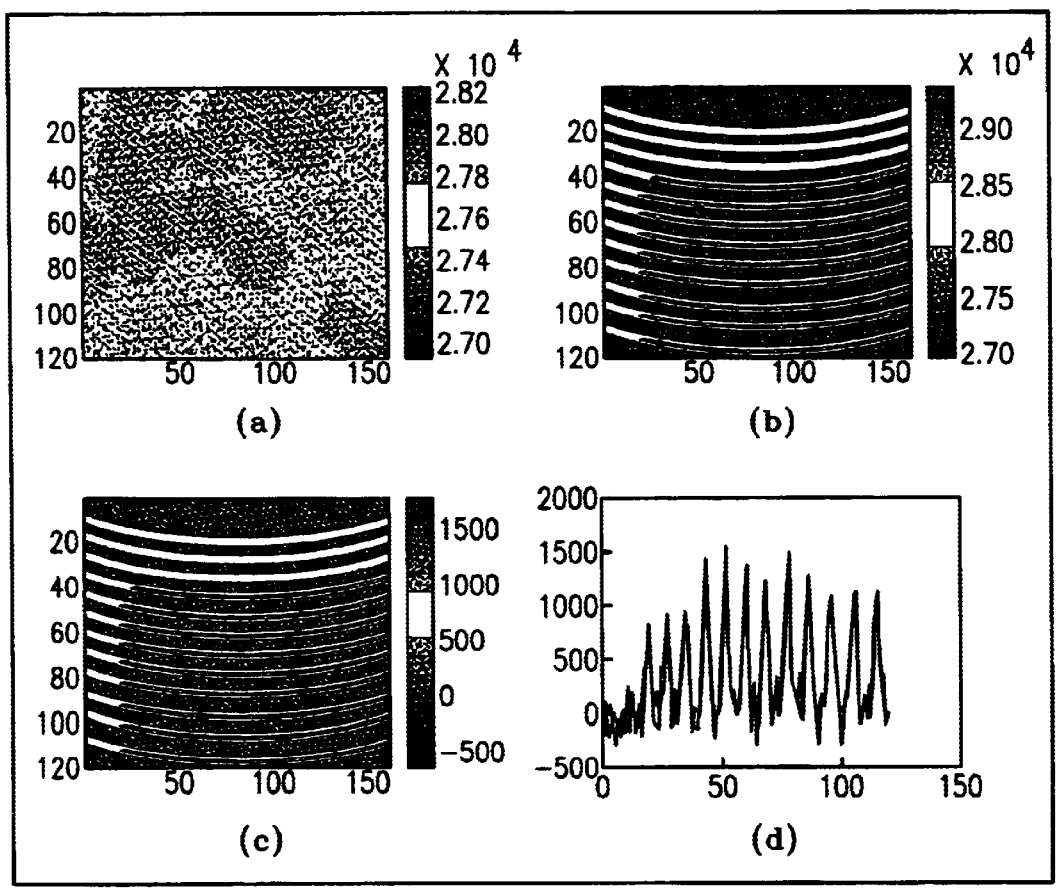
FIG. 3 is an infrared image sequence for an auto backlite taken in accordance with one embodiment of the present invention.

FIG. 3 shows an example of an infrared image sequence for a backlite, taken in accordance with the present invention. FIG. 3a shows an image of the glass backlite taken prior to the application of any external current or power source. The inhomogeneous thermal characteristics of the unpowered, unheated glass are visible in this image. FIG. 3b shows the backlite after the application of electrical heating power. FIG. 3c shows the results of subtracting the unheated image (FIG. 3a) from the heated image (FIG. 3b). The subtraction removes the effects of the inhomogeneous thermal characteristics from the resultant image (FIG. 3c). FIG. 3d shows plots of the infrared emmissivity and thus the heat levels, as a function of vertical distance. Two curved plots are shown, one at ⅓ the distance from the left edge of the image and one at ⅔ the distance.

Figure 4:
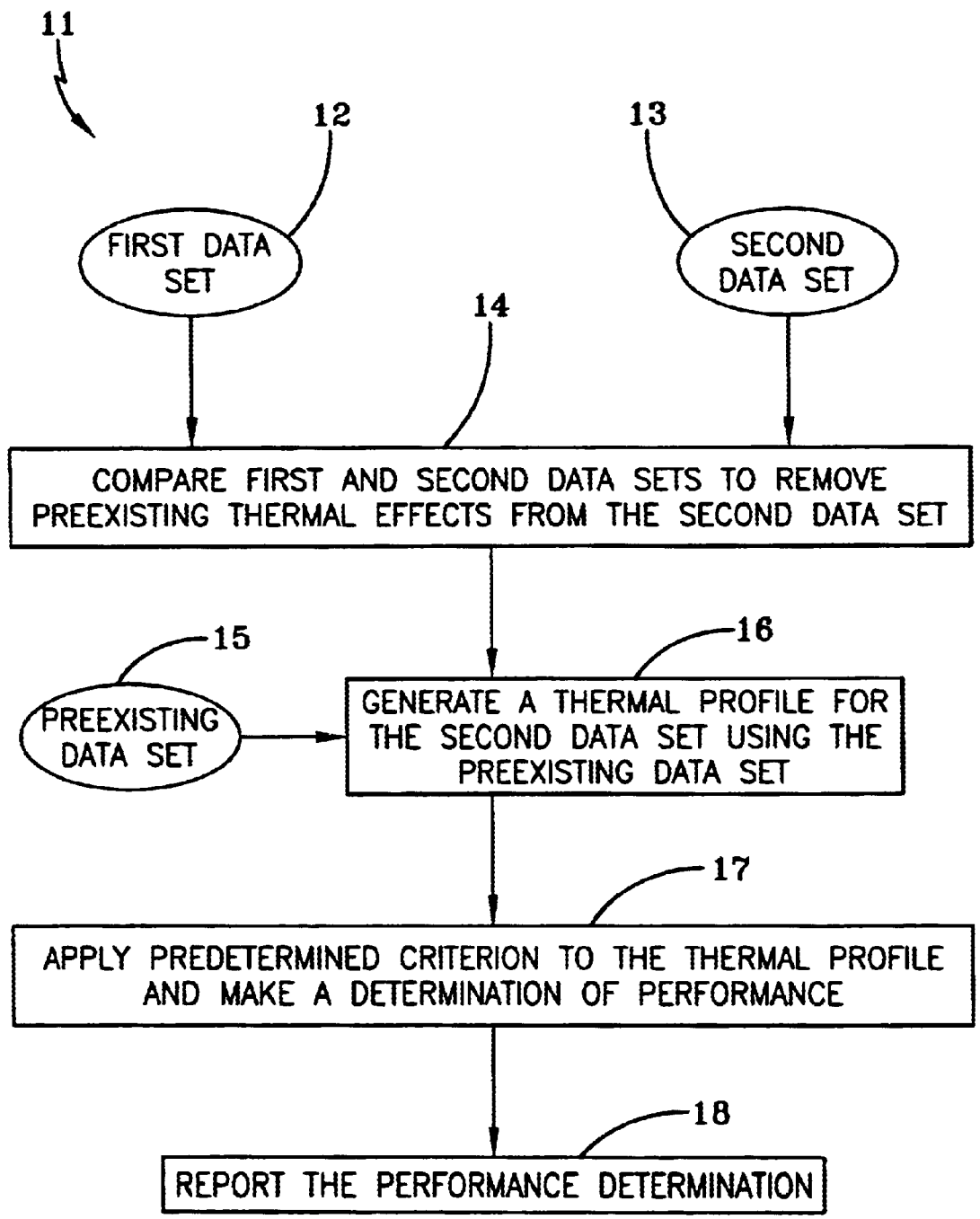
FIG. 4 is a chart showing steps followed by a system in accordance with one embodiment of the present invention.

FIG. 4 shows a preferred step diagram for a system 11 comprising a thermal detector and a microprocessor, preferably an infrared camera and a computer running a software package, for determining thermal performance. The software package or microprocessor may preferably perform the following functions:

(1) Wait for a "test piece ready" signal from the equipment.
(2) Capture an initial set of images and average them. The analog value for the black and white levels and the number of averages may then be set in the camera.
(3) Capture an initial set of image data 12 from the data output of the camera. There is preferably another setting of the black and white levels. Analog voltages outside this span preferably saturate either black or white.
(4) Command the power supply to set a pre-determined voltage level (determined during setup).
(5) Read the associated electrical current, and if the current is not appropriate, send a "no test" signal to the equipment and return to step 1.
(6) Wait for a pre-determined period of time for the test piece to heat up.
(7) Capture a second set of infrared image data 13 using the same setup parameters.
(8) Subtract the background or reference image data from the image data taken when the electrical current was applied, so as to form an image of the change in temperature due to the electrical current 14. This step permits subtraction of pre-existing thermal nonuniformities from the infrared data. The timing and sequence of these steps may be important, and the computer program is preferably able to automatically determine an optimum time or may be programmed by a user to do so.
(9) Extract the coordinates of the line segments to test from a preexisting setup file 15 and use them to crate a thermal profile by averaging along the line segment 16.
(10) Extract baseline and peak values of the thermal profile (preferably 15% averaging for the two ends and 30% averaging for the middle).
(11) Compare the elevation of the center of the thermal profile above the baseline to the threshold value (modified by the multiplication factor).
(12) If the thermal increase in the center of a line is greater than the threshold, mark the line segment "good." Otherwise, mark it "bad."
(13) After all the line segments defined in the setup are tested, tabulate the performance statistics, determine whether the piece meets predetermined specifications 17, and send a "good piece" or "bad piece" signal to the factory. 18
(14) Return to step 1.

Various other computer algorithms may be used to determine the performance of each wire or section of wire in a conductive pattern. This may include wires that have been interconnected by the complexity of the pattern so that there are a number of pathways for current to flow. In a simple but powerful algorithm, the temperature above the wire may be compared to the temperature on either side of the wire to confirm that the wire is properly heating the region. A system user preferably sets the system up to catalog the performance of each wire. If all wires are found to be operating properly, the glass part is preferably determined to be "good." If one or more of the wires is found to not meet the appropriate specifications, the glass part is preferably determined to be "bad."

The determination of whether a part meets the appropriate specifications may involve determining the overall continuity of the conductive pattern, determining the uniformity of the wires of the pattern, and measuring the homogeneity of the wires of the pattern. The identification of a "bad" glass part and any associated "bad" wire(s) may then be automatically reported to the factory system computer for further action, such as repair or recycling. Statistics can be collected, and the specifics of problems may be automatically reported, such as to the section of the assembly line where the wires are printed on or attached to the glass part.

Note that there is preferably also a part of the computer system where an initial setup may be accomplished. In this stage, the identification of each wire in the image, as well as regions where the image is preferred to be cool, may be loaded into the computer. Criterion or thresholds for "good" or "bad" performance may be established, and set as parameters for the operation of the program. Actions for "good" and "bad" parts may be specified.

It is preferable to test several properties of the grid at one time. A preferred system may be able to measure continuity and uniformity during the thermal imaging test, while detecting anomalies such as thermal inhomogeneities and hot or cool spots on the grid. The system would then preferably report all the data to the overall factory system. Appropriate action may then be taken based upon these measurements and appropriate determinations.

The testing may be done at a testing station along an assembly line. In a preferred embodiment, a conveyor brings the backlites or other articles to the test station where the infrared detector is located. The conductive pattern of the article may then be connected to an external power source, such as by robotic or human connection. The data may then be captured and analyzed. Once the performance of the pattern is determined, a signal is preferably sent to robotic actuators near the testing station. If the article meets the desired level of performance, the article may either continue along its path of conveyance, be moved onto a location or device for "good" parts by the robotic actuator, or undergo any other appropriate action. If the article is determined to exhibit unsatisfactory performance, it may be removed from the conveyor by the robotic actuators, moved onto a second conveyor for "bad" parts, or undergo any other appropriate action.

The preferred embodiments herein disclosed are not intended to be exhaustive or to unnecessarily limit the scope of the invention. The preferred embodiments were chosen and described in order to explain the principles of the present invention so that others skilled in the art may practice the invention. Having shown and described preferred embodiments of the present invention, it will be within the ability of one of ordinary skill in the art to make alterations or modifications to the present invention, such as through the substitution of equivalent materials or structural arrangements, or through the use of equivalent process steps, so as to be able to practice the present invention without departing from its spirit as reflected in the appended claims, the text and teaching of which are hereby incorporated by reference herein. It is the intention, therefore, to limit the invention only as indicated by the scope of the claims and equivalents thereof.

What is claimed is:

1. A testing system for a conductive pattern, said testing system comprising:
   (a) an article of manufacture comprising said conductive pattern;
   (b) an electrical power source in contact with said conductive pattern, whereby electrical current may be circulated throughout at least a portion of said conductive pattern;
   (c) an infrared detection device, said infrared detection device adapted to collect data from at least a portion of said conductive pattern; and
   (d) a data collection device adapted to receive data from said infrared detection device.

2. A testing system according to claim 1 wherein said article of manufacture comprises an automotive windshield, automotive backlite, or other automotive component.

3. A testing system according to claim 1 wherein said conductive pattern comprises a printed conductive pattern.

4. A testing system according to claim 1 wherein said infrared detection device comprises an infrared imaging device.

5. A testing system according to claim 1 wherein said data collection device is a computer adapted to collect image data from said infrared detection device, process said image data, and determine performance of at least a portion of said conductive pattern.

6. A testing system according to claim 1 wherein:
   said data collection device is adapted to store preexisting data that includes pattern coordinates of said conductive pattern; and
   said data collection device is adapted to determine the performance of a respective line of said conductive pattern.

7. A testing system according to claim 6 wherein said data collection device is adapted to automatically determine the performance of said respective line of said conductive pattern.

8. A testing system for a glass panel comprising a conductive pattern, said testing system comprising:
   (a) an electrical power source in contact with said conductive pattern, whereby electrical current may be circulated throughout at least a portion of said conductive pattern;
   (b) an infrared imaging device, said infrared imaging device adapted to collect image data from at least a portion of said conductive pattern; and
   (c) a computer adapted to collect said image data from said infrared imaging device, process said image data, determine performance of at least a portion of said conductive pattern, and report the results of said performance.

9. A testing system according to claim 8 wherein:
   said computer is adapted to store preexisting data that includes pattern coordinates of said conductive pattern; and
   said computer is adapted to determine the performance of a respective line of said conductive pattern.

10. A testing system according to claim 9 wherein said computer is adapted to automatically determine the performance of said respective line of said conductive pattern.

11. A method of testing a conductive pattern, said method comprising the steps of:
    (a) collecting a first set of infrared data from a conductive pattern;
    (b) circulating an electrical current throughout said conductive pattern;
    (c) collecting a second set of infrared data from said conductive pattern;
    (d) subtracting said first set of infrared data from said second set of infrared data whereby effects of preexisting thermal non-uniformities may be removed;
    (e) determining the performance of each portion of said conductive pattern; and
    (f) making a decision based upon predetermined criteria.

12. A method of testing a conductive pattern according to claim 11 additionally comprising the step of determining the continuity of at least a portion of said conductive pattern.

13. A method of testing a conductive pattern according to claim 11 additionally comprising the step of determining the uniformity of at least a portion of said conductive pattern.

14. A method of testing a conductive pattern according to claim 11 additionally comprising the step of measuring inhomogeneities of at least a portion of said conductive pattern.

15. A method of testing a conductive pattern according to claim 11 additionally comprising the step of reporting said decision to external devices.

16. A method of testing a conductive pattern according to claim 11 further comprising the step of storing preexisting data that includes pattern coordinates of said conductive pattern such that the performance of a respective line of said conductive pattern can be determined.

17. A method of testing a conductive pattern according to claim 16 wherein the performance of said respective line of said conductive pattern is automatically determined.

* * * * *